United States Patent [19]

Bodere et al.

[11] Patent Number: 5,753,524
[45] Date of Patent: May 19, 1998

[54] METHOD OF FORMING A PLATEAU AND A COVER ON THE PLATEAU IN PARTICULAR ON A SEMICONDUCTOR SUBSTRATE

[75] Inventors: Alain Bodere, Bruyeres Le Chatel; Elisabeth Gaumont-Goarin, Chevreuse, both of France

[73] Assignee: Alcatel Optronics, Paris, France

[21] Appl. No.: 668,628

[22] Filed: Jun. 19, 1996

[30] Foreign Application Priority Data

Jun. 22, 1995 [FR] France .................. 95 07496

[51] Int. Cl.$^6$ .................................. H01L 21/00
[52] U.S. Cl. .................. 437/39; 438/31; 438/696
[58] Field of Search ..................... 438/29, 31, 32, 438/39, 40, 41, 694, 696, 738

[56] References Cited

U.S. PATENT DOCUMENTS 4,857,477  8/1989  Kanamori .

FOREIGN PATENT DOCUMENTS

0542479A1  5/1993  European Pat. Off. .

OTHER PUBLICATIONS

T. Sanada et al., "An Improved Technique for Fabricating High Quantum Efficiency Ridge Waveguide AlGaAs/GaSs Quantum Well Lasers", *Japanese Journal of Applied Pysics*, vol. 25, No. 9, Sep. 1986, Tokyo, JP pp.1443–1444.

*Patent Abstracts of Japan*, vol. 011, No. 187(E-516), 16 Jun. 1987 & JP-A-62 015876 (Matsushita Electric Ind Co Ltd)24 Jan. 1987.

*Primary Examiner*—Tuan H. Nguyen
*Attorney, Agent, or Firm*—Sughrue, Mion, Zinn, Macpeak & Seas, PLLC

[57]  ABSTRACT

Prior to using etching to form a plateau that is to constitute a laser ridge and that is to be provided with a cover constituting a top electrode, the surface of the cover is initially protected with a dielectric mask and the flanks of the cover are then protected with a dielectric coating. The dielectric coating is initially deposited uniformly over the surface and the flanks. It is then etched by directional means so that it remains on the flanks only. The invention is particularly applicable to making an optical amplifier.

5 Claims, 1 Drawing Sheet

METHOD OF FORMING A PLATEAU AND A COVER ON THE PLATEAU IN PARTICULAR ON A SEMICONDUCTOR SUBSTRATE

The present invention relates to a method of forming a plateau and a cover on the plateau. It is particularly applicable to manufacturing a semiconductor component, in particular an optoelectronic component, when the plateau to be covered is formed so that it projects relative to the substrate of the component, and when said cover is to constitute an electrode on the plateau.

BACKGROUND OF THE INVENTION

In one known method, the cover is formed first by etching a cover layer via a mask, and then the plateau is formed by etching the material of the substrate on either side of the cover. But, in that method, the means used to etch the substrate are of a type such that they might also etch the cover. The cover must therefore be protected against said means prior to etching the substrate. That is why the mask used for forming the cover is chosen to withstand not only the cover-etching means, but also the substrate-etching means so that, while the plateau is being formed, the mask constitutes the desired protection for the cover.

In developing the present invention, it was found that components manufactured using that known method had defects resulting in poor and somewhat random performance levels.

OBJECTS AND SUMMARY OF THE INVENTION

A particular object of the invention is to make it possible to improve and/or to guarantee the performance levels of such components.

To this end, the present invention provides a method of forming a plateau and a cover on said plateau, in particular on a semiconductor substrate, the method including the following steps:

making a substrate having an optionally horizontal exposed face;

defining substrate-etching means that are suitable for etching the substrate;

depositing a cover layer on said exposed face, which cover layer is sensitive to the substrate-etching means;

defining cover-etching means that are suitable for etching the cover layer;

forming a mask that withstands the substrate-etching means and the cover-etching means, and that covers a limited cover zone of the cover layer;

applying the cover-etching means via the mask so that the cover layer remains in the form of a cover having a surface in the cover zone and a flank projecting relative to said exposed face in a flank zone at the edge of the cover zone, the cover being removed in a side zone extending beyond the flank zone; and applying the substrate-etching means so as to etch said substrate in said side zone so that a protected portion of said substrate constitutes said plateau under said cover;

wherein, between application of the cover-etching means and application of the substrate-etching means, it further includes the following steps:

forming a coating constituting a top coating, a flank coating, and a substrate coating respectively occupying the cover zone, the flank zone, and the side zone and having respective surfaces; and applying coating-etching means having a selective etching direction forming a smaller angle with the surface of the flank coating than with the surfaces of the top coating and of the substrate coating, this application being stopped once the etching means have completely removed the plateau coating and the substrate coating but not the flank coating.

In developing the invention, a cause was found for certain defects in components manufactured using the known method. This cause is that, while the substrate is being etched, the etching means used also etch the flank of the previously formed cover slightly. As a result of that unwanted etching, some of the atoms of the material of the cover are re-deposited on the substrate in the vicinity of the cover, and they then interfere with the remainder of the process of etching the substrate.

More generally, the invention is applicable when a particular cover material and a particular substrate-etching means offer specific advantages, but are incompatible to an extent such that all contact between them must be avoided, e.g. because the cover would be damaged by being etched via its flank, or because the products of such etching would cause problems, or else because such contact would enable an unwanted electric current to flow through it, etc. The invention then makes it possible to enjoy the advantages in spite of the incompatibility.

BRIEF DESCRIPTION OF THE DRAWINGS

An implementation of the present invention is described below in more detail by way of non-limiting example and with reference to the accompanying diagrammatic figures. When the same element is shown in more than one figure, it is designated therein by the same reference.

MORE DETAILED DESCRIPTION

Figure 1:
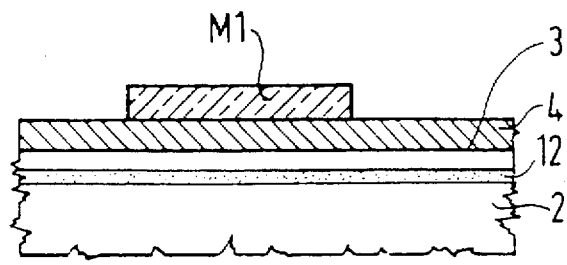
FIGS. 1 to 5 are section views through an optoelectronic component manufactured by using the method of the invention, and shown at successive stages of the method.

As known, and as shown in FIG. 1, a substrate 2 was made having an optionally horizontal exposed face 3. Substrate-etching means suitable for etching the substrate were defined. A cover layer 4 sensitive to the substrate-etching means was deposited on said exposed face. Cover-etching means suitable for etching the cover layer were defined, and a mask M1 was formed withstanding the substrate-etching means and the cover-etching means, and covering a limited cover zone ZC of the cover layer.

Figure 2:
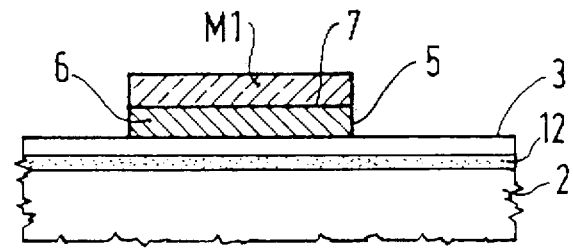

As shown in FIG. 2, the cover-etching means were applied via the mask so that the cover layer remained in the form of a cover 6 having a surface 7 in the cover zone and a flank 5 projecting relative to the exposed face in a flank zone ZF at the edge of the cover zone ZC, the cover being removed in a side zone ZS extending beyond the flank zone.

Figure 5:
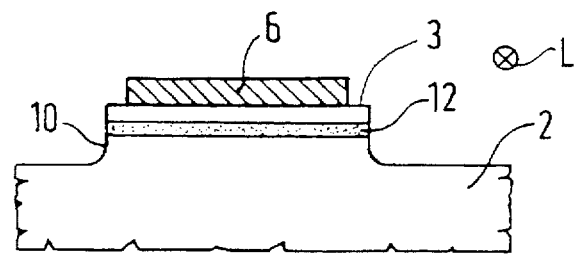

As shown in FIG. 5, the substrate-etching means were applied so as to etch the substrate 2 in the side zone ZS so that that portion of the substrate which is situated under the cover 6 and which is protected thereby constitutes a plateau 10.

Figure 3:
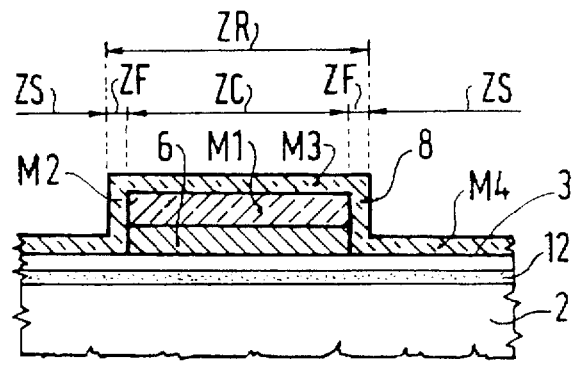
Figure 4:
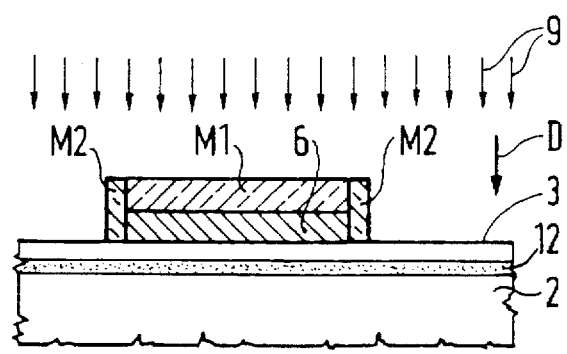

As shown in FIG. 3, and according to the present invention, between application of the cover-etching means and application of the substrate-etching means, a coating 8 was formed. Various portions of the coating constituted a top coating M3, a flank coating M2, and a substrate coating M4 respectively occupying the cover zone ZC, the flank zone ZF, and the side zone ZS and having respective surfaces. Then, as shown in FIG. 4, coating-etching means were applied having a selective etching direction D forming a smaller angle with the surface of the flank coating than with the surfaces of the top coating and of the substrate coating M4. This application was stopped once the etching means had completely removed the plateau coating and the substrate coating but not the flank coating.

Preferably, the coating 8 is formed by depositing substantially uniformly and isotropically a coating material that is resistant to the substrate-etching means, each of said cover-etching means and said coating-etching means having a selective etching direction D, the direction being common to them and vertical when said exposed face 3 is horizontal.

Preferably, the mask M1 and said flank coating M2 are removed after applying the substrate-etching means.

In an implementation, the substrate 2 is a semiconductor substrate and it includes an optically amplifying and guiding active layer 12. The cover zone ZC and the flank zone ZF together constitute a ridge zone ZR extending in a longitudinal direction L between two of said side zones ZS.

Application of the substrate-etching means removes the active layer in the side zones, so that it remains in limited manner in the ridge zone in the form of a laser ridge 10 constituting said plateau.

The cover layer 4 is metallic so that the cover 6 constitutes a top electrode for the laser ridge. Typically, it is based on gold and titanium. In developing the present invention, it was found that without the flank coating M2, substrate-etching means that otherwise have certain advantages also etched the flanks of the electrode, and that some of the metal ions or atoms dislodged from the flanks were deposited on the substrate and interfered with the remainder of the etching process.

For example, when an optoelectronic component including an optical waveguide, in particular an optical amplifier, is to be made, a bottom electrode is formed in contact with a bottom face (not shown) of the substrate. In which case, preferably, the mask M1 and the coating 8 are made of a dielectric such as silica $SiO_2$ or silicon nitride $Si_3N_4$, the cover-etching means are constituted by ion beam etching, the coating is deposited by plasma enhanced chemical vapor deposition, the coating-etching means are constituted by reactive ion etching whereby reactive ions created in a plasma are accelerated towards the semiconductor substrate, and said substrate-etching means are constituted by reactive ion beam etching or by reactive ion etching.

These substrate-etching means offer the advantages of providing a high level of uniformity, and good etching reproducibility.

We claim:

1. A method of forming a plateau and a cover on said plateau, in particular on a semiconductor substrate, the method including the following steps:

making a substrate having an optionally horizontal exposed face;

defining substrate-etching means that are suitable for etching the substrate;

depositing a cover layer on said exposed face, which cover layer is sensitive to the substrate-etching means;

defining cover-etching means that are suitable for etching the cover layer;

forming a mask that withstands the substrate-etching means and the cover-etching means, and that covers a limited cover zone of the cover layer;

applying the cover-etching means via the mask so that the cover layer remains in the form of a cover having a surface in the cover zone and a flank projecting relative to said exposed face in a flank zone at the edge of the cover zone, the cover being removed in a side zone extending beyond the flank zone; and applying the substrate-etching means so as to etch said substrate in said side zone so that a protected portion of said substrate constitutes said plateau under said cover;

wherein, between application of the cover-etching means and application of the substrate-etching means, it further includes the following steps:

forming a coating constituting a top coating, a flank coating, and a substrate coating respectively occupying the cover zone, the flank zone, and the side zone and having respective surfaces; and applying coating-etching means having a selective etching direction forming a smaller angle with the surface of the flank coating than with the surfaces of the top coating and of the substrate coating, this application being stopped once the etching means have completely removed the plateau coating and the substrate coating but not the flank coating.

2. A method according to claim 1, said step of forming a coating being performed by depositing substantially uniformly and isotropically a coating material that is resistant to the substrate-etching means, each of said cover-etching means and said coating-etching means having a selective etching direction, the direction being common to them and vertical when said exposed face is horizontal.

3. A method according to claim 1, said mask and said flank coating being removed after applying the substrate-etching means.

4. A method according to claim 1, said substrate being a semiconductor substrate and including an optically amplifying and guiding active layer;

said cover zone and said flank zone together constituting a ridge zone extending in a longitudinal direction between two of said side zones;

said application of the substrate-etching means removing the active layer in the side zones, so that it remains in limited manner in said ridge zone in the form of a laser ridge constituting said plateau, said cover layer being metallic so that said cover constitutes a top electrode for the laser ridge.

5. A method according to claim 4, said mask and said coating being constituted by a dielectric such as silica $SiO_2$ or silicon nitride $Si_3N_4$;

said cover-etching means being constituted by ion etching, said coating being deposited by plasma enhanced chemical vapor deposition, said coating-etching means being constituted by reactive ion etching, and said substrate-etching means being constituted by reactive ion beam etching.

* * * * *